(12) United States Patent
Lutsenko et al.

(10) Patent No.: US 9,042,419 B1
(45) Date of Patent: May 26, 2015

(54) LASER CONVERTER FOR EMITTING A GREEN LASER

(71) Applicants: King Abdul Aziz City for Science and Technology, Riyadh (SA); Stepanov Institute of Physics of the National Academy of Sciences, Minsk (BY); Ioffe Physical-Technical Institute of the Russian Academy of Sciences, St. Petersburg (RU)

(72) Inventors: Evgenii Lutsenko, Minsk (BY); Aliaksei Vainilovich, Minsk (BY); Viacheslav Pavlovskii, Minsk (BY); Gennadii Yablonskii, Minsk (BY); Ahmed Alyamani, Riyadh (SA); Salman A Alfihed, Riyadh (SA); Ahmed Alabbas Hamidalddin, Riyadh (SA); Sergey Ivanov, St. Petersburg (RU); Irina Sedova, St. Petersburg (RU); Sergei Sorokin, St. Petersburg (RU); Sergei Gronin, St.Petersburg (RU)

(73) Assignee: KING ABDULAZIZ CITY FOR SCIENCE AND TECHNOLOGY (KACST), Riyadh (SA)

( * ) Notice: Subject to any disclaimer, the term of this patent is extended or adjusted under 35 U.S.C. 154(b) by 0 days.

(21) Appl. No.: 14/154,479

(22) Filed: Jan. 14, 2014

(51) Int. Cl.
| | | |
|---|---|---|
| H01S 3/16 | (2006.01) |
| H01S 3/091 | (2006.01) |
| H01S 5/00 | (2006.01) |
| G02F 1/35 | (2006.01) |
| G02F 1/365 | (2006.01) |

(52) U.S. Cl.
CPC .............. *H01S 5/0092* (2013.01); *G02F 1/353* (2013.01); *G02F 1/365* (2013.01)

(58) Field of Classification Search
USPC ............ 372/21, 22, 39, 42, 43.01, 45.012, 70
See application file for complete search history.

(56) References Cited

U.S. PATENT DOCUMENTS

2009/0304034 A1* 12/2009 Mirov et al. ................... 372/20
2014/0185640 A1* 7/2014 Jain .......................... 372/45.011

* cited by examiner

*Primary Examiner* — Armando Rodriguez
(74) *Attorney, Agent, or Firm* — Timberline Patent Law Group PLLC

(57) ABSTRACT

The invention provides a laser converter for converting a laser radiation of shorter wavelength to a laser radiation of longer wavelength using a single stage conversion. The laser converter comprises a laser diode for emitting a laser radiation in a first wavelength range, a cylindrical microlens for transferring and focusing the laser radiation to a laser chip and the laser chip for absorbing the laser radiation and emitting the laser radiation in a second wavelength range.

7 Claims, 3 Drawing Sheets

LASER CONVERTER FOR EMITTING A GREEN LASER

FIELD OF THE INVENTION

The invention generally relates to a laser emitting in a green spectral range. More specifically, the invention relates to a green laser converter for converting a laser radiation of a shorter wavelength to a laser radiation of a longer wavelength.

BACKGROUND OF THE INVENTION

Compact lasers that emit radiations in green spectral range with wavelength from 510 nanometers (nm) to 570 nm find their application in various fields ranging from biology and medicine to optical communications and multimedia laser projectors such as picoprojectors.

There exist different techniques to fabricate a compact green laser using different types of laser diodes. One such technique comprises a Diode Pumped Solid State Laser (DPSSL) with Second Harmonic Generation. DPSSL utilizes two-stage light conversion, wherein the first stage includes transformation of laser diode pumping emission into a solid state laser infrared emission and the second stage includes conversion of the solid state laser emission into a second harmonic radiation. The second harmonic radiation emitters have relatively large dimensions, complex design increasing the cost and are not highly efficient.

Another such technique utilizes Second Harmonic Generation (SHG) of laser diodes emission. Laser diodes with SHG use one stage of conversion, wherein an infrared laser diode emission is directly converted to a second harmonic radiation. This ensures small dimensions and high efficiency (Wall Plug Efficiency (WPE)) which is about 10%. SHG lasers make use of periodically poled $LiNbO_3$ crystal for efficient conversion. Since, a crystal of periodically poled $LiNbO_3$ is very expensive, therefore producing cheap laser diodes with SHG on a mass scale is a challenging task.

Direct emitting laser diodes based on InGaN have demonstrated efficient laser emission in green range, however for the green laser emission with a wavelength longer than 540 nm the efficiency of direct emitting InGaN laser diodes drops significantly.

There is a lot of research still going on for efficiently generating compact green laser radiation sources with optimum power value and wavelength.

There is therefore a need of a laser converter that efficiently converts a shorter wavelength laser diode emission (violet-blue) to a longer wavelength green laser emission with a single stage conversion.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the invention.

Figure 1:
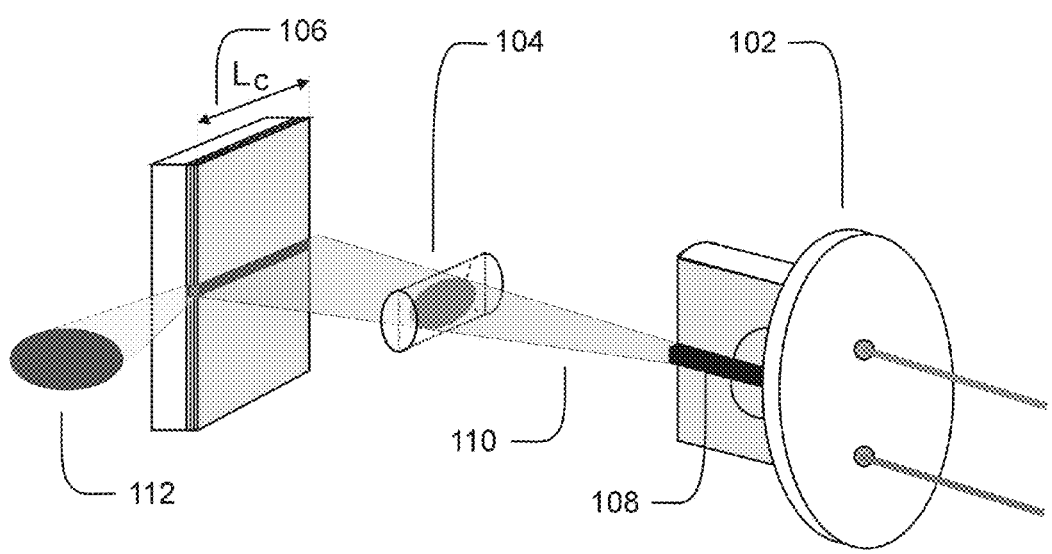
FIG. 1 illustrates an exemplary embodiment of the laser converter in accordance with the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

Before describing in detail embodiments that are in accordance with the invention, it should be observed that the embodiments reside primarily in a laser converter for converting a laser emission of short wavelength to a laser emission of long wavelength. Accordingly, the system components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Generally speaking, pursuant to various embodiments, the invention provides a laser converter for converting a short wavelength laser emission to a long wavelength laser emission using a single stage conversion.

FIG. 1 illustrates an exemplary embodiment of the laser converter in accordance of which various embodiments of the invention may function. A laser diode 102, a microlens 104 and a laser chip 106, with a chip 108 within the laser diode for emitting a shorter wavelength laser radiation 110, are utilized for emitting a green laser radiation 112 with a wavelength longer than wavelength of the laser diode 102. As shown in FIG. 1, microlens 104 is positioned adjacent to laser diode 102 from which chip 108 emits shorter wavelength laser radiation 110. Laser chip 106 is positioned adjacent to microlens 104 in a manner that the laser radiation emitted by laser diode 102 falls on middle region of laser chip 106.

The composition of laser diode 102 includes a substrate made of n type Gallium Nitride (GaN) at the bottom, a first semiconductor layer over the substrate and a second semiconductor layer deposited over the first semiconductor layer. Although the substrate is considered to be made of GaN, a person skilled in the art would realize the use of other equivalent semiconductor materials for the substrate. In an exemplary embodiment, the first semiconductor layer is made up of n-type GaN and the second semiconductor layer is made of N-type Aluminum Gallium Nitride (N-AlGaN). Although the first semiconductor layer and the second semiconductor layer are considered to be made of n-type GaN and N-AlGaN, a person skilled in the art would realize the use of other equivalent semiconductor materials for the first and second semiconductor layers. In another exemplary embodiment, laser diode 102 is composed of group-III nitrides (III-N).

Figure 2:
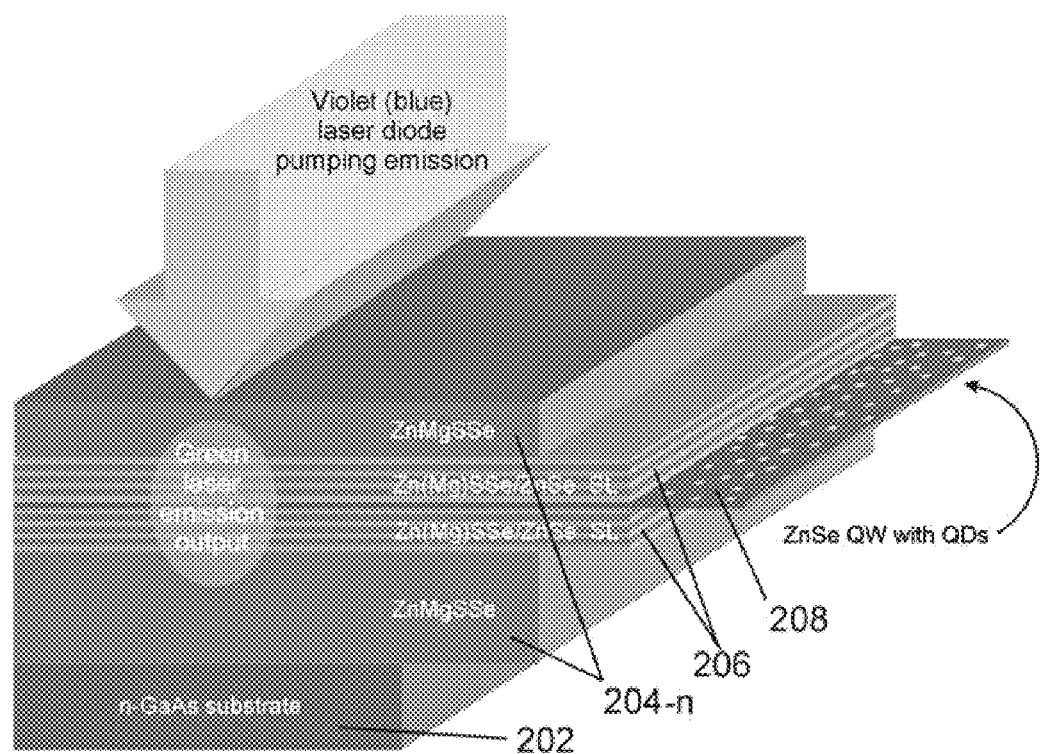
FIG. 2 illustrates an exemplary embodiment of a laser chip of the laser converter in accordance with an embodiment of the invention.

FIG. 2 illustrates an exemplary embodiment of composition of the laser chip 106 in accordance with an embodiment of the invention. As shown in FIG. 2, laser chip 106 is made of a semiconductor substrate 202, a bottom cladding layer 204-1 and a top cladding layer 204-2, a waveguide 206 and an active region 208. Semiconductor substrate 202, bottom cladding layer 204-1, top cladding layer 204-2, waveguide 206 and active region 208 forms a laser heterostructure for laser chip 106. Waveguide 206 is selected based on parameters such as, but not limited to, period, thickness and composition of superlattices included, thickness of the waveguide and the position of the active region in the waveguide. The parameters are selected on the basis of calculations such that a maximum electromagnetic field of fundamental mode of waveguide 206 lies in the middle of active region 208. Waveguide 206 includes both plane gap and graded index superlattices (SLs). The graded index SLs improve transport of non-equilibrium charge carriers into active region 208 and reduce lasing threshold. The SLs enable variations in band gap and stress profile of laser chip 106 without changing the technological parameters of Molecular Beam Epitaxy (MBE) process as laser chip 106 parameters are extremely sensitive to any fluctuations in the growth parameters and growth interruptions. This ensures high reproducibility of a technological process and minimum deviation of parameters of the implemented structure from those of an estimated structure.

As shown in FIG. 2, semiconductor substrate 202 is made of Gallium Arsenide (GaAs), bottom cladding layer 204-1 and top cladding layer 204-2 are made of ZnMgSSe semiconductor compound, and waveguide 206 grown atop of bottom cladding layer 204-1 includes a set of graded index ZnMgSSe/ZnSe SLs composed of periodically repeated thin ZnMgSSe and ZnSe layers. The thin ZnMgSSe and ZnSe layers are of different thickness ratio between different graded index SLs in order to produce a graded index variation, and a ZnSSe/ZnSe SL with constant band gap surrounding active region 208. Active region 208 is composed of one or more ZnSe quantum wells (QWs) with Cadmium Selenide (CdSe) Quantum Dot (QD) insertions. The QD insertions are located in either closely spaced thin ZnSe QWs or in a thicker single ZnSe QW placed in a maximum electromagnetic field of fundamental mode of waveguide 206. This provides better tunneling of non-equilibrium charge carriers between the QD insertions and increases the uniformity of pumping. Although, semiconductor substrate 202, bottom cladding layer 204-1 and top cladding layer 204-2, waveguide 206, and active region 208 are illustrated to be respectively made of GaAs, ZnMgSSe compound, superlattices comprising thin ZnMgSSe, ZnSSe, and ZnSe layers, and CdSe QDs embedded into ZnSe QW, a person skilled in the art would realize the use of other equivalent semiconductor materials as well. In another exemplary embodiment, waveguide 206 includes a constant band gap ZnSSe/ZnSe SL, and active region 208 is made of one or more ZnCdSe QWs embedded in ZnSSe/ZnSe SL waveguide, or CdSe QDs each embedded into the ZnCdSe QW. The latter provides a longer wavelength of the laser radiation. For all types of structures, mechanical compressive stresses generated by the graded index ZnMgSSe/ZnSe SLs and active region 208 are compensated by tensile mechanical stresses induced by the ZnSSe/ZnSe SL with constant band gap. The compressive stresses are compensated in such a manner that the structure remains pseudomorphic to a lattice constant of the GaAs substrate. This prevents the structure from extended defects generation thereby providing high quantum efficiency. In addition, the critical thickness of the SL are kept larger than critical thickness of bulk semiconductor layers with the same lattice mismatch, thereby providing better resistance to thermal elastic deformations.

The laser heterostructure is formed as a laser cavity for laser chip 106. The cavity length of laser chip 106 is optimal for minimal threshold pumping power and is maintained in the range from 50 micrometers (μm) to about 300 μm. The cavity length is selected to maintain low threshold power for the green laser as value of the laser threshold power depends on the active region structure, the QW composition and QD insertions number. One of the cavity edges is covered by Distributed Bragg Reflector (DBR) as a blind mirror in order to ensure the laser radiation is only in one direction and to reduce the laser threshold. Such cavity length ensures low dimensions of the laser diode pumping spot thereby keeping the irradiated laser chip 106 close to output face of laser diode 102. Under such a condition, the laser cavity length of laser chip 106 requires only one microlens positioned very close between laser chip 106 and laser diode 102. This creates extremely compact converter design that can be positioned even inside a standard laser diode package.

Laser diode 102 is utilized for emitting the laser radiation in a shorter wavelength range. An injection current through the laser diode results in injection of electrons and holes into the active region and their recombination which generates the laser radiation in the wavelength range of about 400 nm to about 450 nm. Since microlens 104 is positioned adjacent to laser diode 102, the laser radiation emitted from laser diode 102 falls on microlens 104. Microlens 104 is utilized to converge and focus the laser beam on laser chip 106 based on the predefined parameters. The pumping laser radiation is focused on a cavity surface of laser chip 106. After receiving the laser radiation, laser chip 106 converts it into laser radiation in the second wavelength range. In an embodiment, the second wavelength range is from about 510 nm to about 570 nm. The converted laser radiation is then emitted out from cavity edge of laser chip 106. In an embodiment, the converted laser radiation is a green laser radiation.

Figure 3:
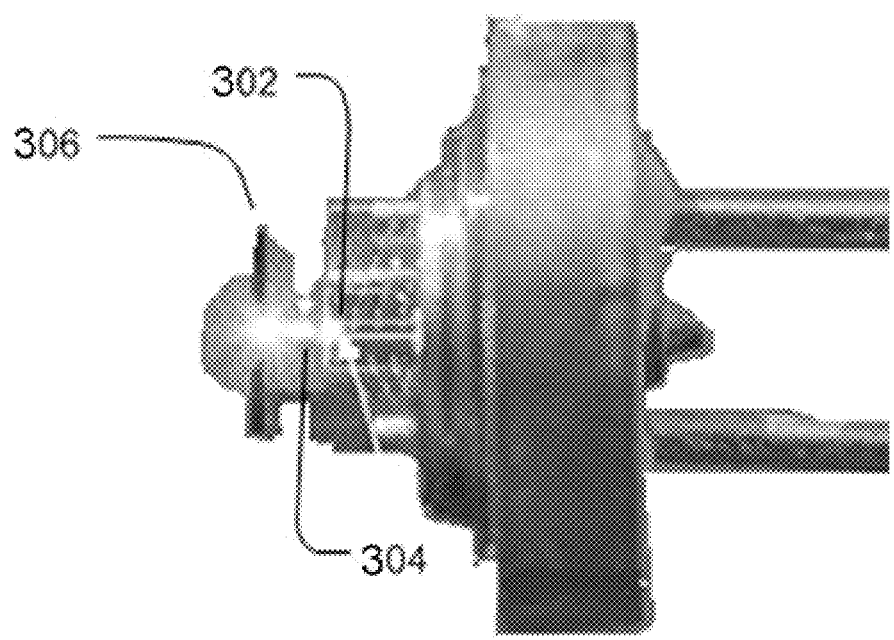
FIG. 3 illustrates an operating prototype of the laser converter in accordance with an embodiment of the invention.

FIG. 3 illustrates a working prototype of the laser converter in which a streak of laser radiation is visible. The pumping laser radiation on right side as shown in FIG. 3 is emitted from cavity edge of laser diode 302. The laser radiation emitted by laser diode 302 is violet or blue laser radiation. The laser radiation then passes through a microlens 304 which focuses the laser radiation on a laser chip 306. After falling on the laser chip 306, the violet or blue laser radiation is absorbed by SL waveguide and active regions due to which a laser action in the heterostructure of laser chip 306 occurs in the green spectral range. The laser action results in emission of the laser radiation in the second wavelength range from about 510 nm to about 570 nm.

Various embodiments of the invention provide a laser converter for converting a laser radiation of a shorter wavelength to a laser radiation of a longer wavelength using a single stage conversion. Therefore, the laser converter provides an efficient way of converting the laser radiation, which reduces the overall cost of a compact green laser.

Those skilled in the art will realize that the above recognized advantages and other advantages described herein are merely exemplary and are not meant to be a complete rendering of all of the advantages of the various embodiments of the invention.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A microchip laser converter comprising:
a laser diode for emitting a laser radiation at a wavelength of about 400 nm to about 450 nm;
a cylindrical microlens of a predefined diameter for focusing the laser radiation emitted from the laser diode; and
a laser chip comprising a semiconductor substrate, a bottom cladding layer, a top cladding layer, a waveguide and active regions, the waveguide comprising a set of graded index layers of one of ZnMgSSe/ZnSe superlattices (SLs), and a layer of one of ZnSSe/ZnSe SL with constant band gap surrounding the active region, wherein the set of graded index layers is composed of periodically repeated thin ZnMgSSe and ZnSe layers, with different thickness ratio between different graded index SLs, wherein the active region comprises one or more ZnSe Quantum Wells (QWs) with a plurality of CdSe quantum dot (QD) insertions each located in one of a closely spaced thin ZnSe QWs or all located in a thick single ZnSe QW placed in a maximum electromagnetic field of fundamental mode of the waveguide, wherein the laser chip is configured to:
receive the laser radiation from the cylindrical microlens on a stripe on the laser chip; and
emit the laser radiation at a wavelength of about 510 nm to about 570 nm.

2. The microchip laser converter of claim 1, wherein the laser diode emits blue or violet laser radiation.

3. The microchip laser converter of claim 1, wherein the semiconductor substrate, the bottom cladding layer, the top cladding layer, the waveguide and the active region form a laser heterostructure.

4. The microchip laser converter of claim 3, wherein the laser heterostructure is formed as a laser cavity with a high reflective Distributed Bragg Reflector (DBR) deposited on one edge of the laser cavity.

5. The microchip laser converter of claim 1, wherein the laser chip emits a green laser radiation.

6. The microchip laser converter of claim 1, wherein the semiconductor substrate of the laser chip is made of a GaAs compound.

7. The microchip laser converter of claim 1, wherein the bottom cladding layer and the top cladding layer are made of ZnMgSSe compound.

* * * * *